United States Patent [19]

Pinneo

[11] Patent Number: 5,449,412
[45] Date of Patent: *Sep. 12, 1995

[54] APPARATUS AND METHOD FOR CONTROLLING PLASMA SIZE AND POSITION IN PLASMA-ACTIVATED CHEMICAL VAPOR DEPOSITION PROCESSES

[75] Inventor: John M. Pinneo, Redwood City, Calif.

[73] Assignee: Crystallume, San Jose, Calif.

[*] Notice: The portion of the term of this patent subsequent to Jul. 27, 2010 has been disclaimed.

[21] Appl. No.: 60,953

[22] Filed: May 13, 1993

Related U.S. Application Data

[63] Continuation of Ser. No. 809,288, Dec. 17, 1991, Pat. No. 5,230,740.

[51] Int. Cl.[6] .................. C23C 16/30; C23C 16/50
[52] U.S. Cl. .................. 118/723 MP; 118/723 MW; 118/723 ME; 315/111.21; 333/159; 333/99 PL
[58] Field of Search ....... 118/715, 723 MP, 723 MW, 118/723 ME, 723 MR, 723 MA; 333/157, 159, 99 PL; 315/111.21, 111.41; 156/345

[56] References Cited

U.S. PATENT DOCUMENTS

| | | | |
|---|---|---|---|
| 2,716,221 | 8/1955 | Allen | 333/159 |
| 4,420,729 | 12/1983 | Ashforth | 333/159 |
| 4,613,836 | 9/1986 | Evans | 333/159 |
| 4,877,509 | 10/1989 | Ogawa et al. | 156/345 X |
| 4,909,184 | 3/1990 | Fujiyama | 118/723 |
| 4,989,542 | 2/1991 | Kamo | 118/723 MW |
| 5,188,862 | 2/1993 | Itatani et al. | 427/570 |
| 5,271,971 | 12/1993 | Herb et al. | 427/577 |
| 5,276,386 | 1/1994 | Watanabe et al. | |

FOREIGN PATENT DOCUMENTS

| | | | |
|---|---|---|---|
| 630797 | 11/1961 | Canada | 333/159 |
| 63-72123 | 4/1988 | Japan | |
| 1-24094 | 1/1989 | Japan | |

Primary Examiner—Robert Kunemund
Assistant Examiner—Jonathan D. Baskin
Attorney, Agent, or Firm—D'Alessandro & Ritchie

[57] ABSTRACT

A block of dielectric material having a long axis and a short axis and having low losses at a selected microwave frequency and a dielectric constant selected to produce a desired degree of phase modulation is mounted on a rotatable shaft in an orientation perpendicular to the long and short axes and arranged inside a waveguide feeding a CVD reactor containing a plasma species. The block is spun by a rotational force applied to the shaft at an angular acceleration such that the two axes of the block successively intersect the axis of the waveguide within the decay period of the plasma species. The frequency of phase modulation can be varied by changing the angular acceleration of the shaft, and the amplitude of the phase modulation can be varied by changing the ratio of block length to thickness and/or by selecting a material with higher dielectric constant. The incident microwave power may be modulated as a function of angular position of the spin shaft. By moving the apparent plasma and modulating the applied microwave power, a customized temperature profile may be achieved over a desired substrate area.

12 Claims, 4 Drawing Sheets

APPARATUS AND METHOD FOR CONTROLLING PLASMA SIZE AND POSITION IN PLASMA-ACTIVATED CHEMICAL VAPOR DEPOSITION PROCESSES

This is a continuation of application Ser. No. 07/809,288, filed Dec. 17, 1991, now U.S. Pat. No. 5,230,740.

BACKGROUND OF THE INVENTION

1. Field of the Invention

The present invention relates to microwave plasma-enhanced CVD deposition techniques for production of CVD materials such as diamond. More particularly, the present invention relates to methods for controlling and enhancing plasma size and substrate temperature uniformity in microwave plasma-enhanced CVD processes.

2. The Prior Art

Diamond and other films are now routinely deposited using a variety of plasma-enhanced chemical vapor deposition techniques. Of the many techniques available, microwave CVD formation of diamond is particularly advantageous because of the quality of material it produces and in the deposition rates which can be achieved.

There are, however, two problems which limit the utility of microwave-enhanced diamond CVD. These are difficulty in coverage of large areas due to small plasma size, and presence of significant thermal gradients which degrade deposition uniformity. Both of these problems adversely affect diamond growth economies and limit the range of applications for which the material can be used. These problems are also extant in plasma-driven CVD processes for forming other materials.

Certain chemical vapor deposition (CVD) processes proceed by use of a plasma which activates gases and thereby drives the chemistry which results in deposition of the desired material. The excited species created are usually unstable and decay through various processes within a few milliseconds. While plasmas can be ignited and sustained by application of electrical energy through a variety of modalities, a particularly advantageous means is use of microwave radiation, often at a frequency of about 2.45 GHz.

In some CVD processes, notably CVD formation of diamond, deposition chemistry considerations dictate that the process be carried out at gas pressures above 1 Torr. Gaseous mixtures used for diamond growth commonly employ large fractions of hydrogen. Small plasma volumes, typically not larger in diameter than one quarter of the wavelength of the excitation radiation, are produced under these gas mixture and pressure conditions. At 2.45 GHz, therefore, plasmas are typically about 1 inch in diameter. This occurs due to the so-called cavity mode operation, in which standing wave patterns are formed within a resonant cavity, and plasma ignition occurs at high field intensity locations in the standing wave pattern.

The deposition substrate and reaction chamber parts are strongly heated by the plasma fireball, and in many current CVD diamond reactors, this radiation provides all the needed process heating. This heat distribution is strongly nonuniform.

Small plasma size creates a serious problem in that the deposition process varies strongly with respect to proximity to the plasma in a number of critical parameters, including growth rate, diamond quality, and surface structure. These nonuniformities critically affect the technical and economic feasibility of manufacture of various products using diamond films deposited by microwave plasma CVD because they limit the batch size of any CVD run.

Alternative plasma excitation methods are either inferior or do not work. DC glow-discharge allows coverage of large t areas, but at very low growth rates and with material quality lower than that available by microwave means. RF capacitive (parallel-plate) plasma excitation, a common and very useful modality extensively employed in CVD of silicon and other electronic materials, has to date proven incapable of diamond deposition. RF inductive plasmas, while capable of diamond deposition, suffer from non-uniformities due to small plasma size and disadvantageously low growth rates. The ECR (electron cyclotron resonance) mode of microwave plasma excitation can provide extremely large, uniform plasmas, but diamond deposition chemistry is not compatible with the very low pressures at which ECR must be performed (typically $10^{-4}$ Torr or less). Magnetic enhancement of microwave plasmas at pressures above about 10 Torr is not effective.

One means of obtaining larger-sized plasmas is to employ a longer wavelength of excitation radiation. For example, if 915 MHz radiation is used, a larger plasma can be formed because the wavelength is larger than that of the 2.45 GHz radiation described above. This change in wavelength mitigates, but does not abolish, the nonuniformities related to plasma size noted earlier. However, selection of longer wavelength (lower frequency) radiation increases the risk of failure of diamond deposition chemistry due to frequency-related effects. Cost issues arise as well, because lower-frequency sources are generally more expensive than the industrial standard 2.45 GHz sources, and component sizes are larger and more costly.

Another parameter which affects diamond film growth rate and quality is the temperature at which the growth process is performed. This variation leads to thickness and quality nonuniformities which are generally of significant detriment to the economic production of useful diamond films.

Thermal gradients arise in microwave-enhanced diamond CVD systems because substrates are strongly heated by radiation from plasma regions. Because the plasma regions are small and located quite close to the substrate (and may in fact be in contact with the substrate), the rate of local heat delivery to the substrates is greatest nearest the plasma. The substrate region nearest the center of the plasma region is therefore the hottest region.

Thermal radiation effects modify the heat distribution on a substrate undergoing diamond deposition. It is often desirable for engineering reasons to have within the reactor a number of structures which are heated more or less strongly as the deposition proceeds. As the substrate radiates heat, these heated structures re-radiate heat back to the substrate. It is most commonly observed that substrates lose heat more rapidly at their edges (which are often close to cool reactor walls) than at their centers. This encourages development of a center-to edge thermal gradient even in absence of strong gradients imposed by the nonuniform nature of the heat flux from the plasma.

It would therefore be advantageous to provide a means of spreading small cavity-mode plasmas to larger sizes without having to compromise the diamond deposition chemistry and thus the quality of the resulting product.

It would also be advantageous to provide a way to provide a more controlled heating of the substrate material during CVD diamond deposition processes.

BRIEF DESCRIPTION OF THE INVENTION

The present invention provides apparatus and methods for circumventing both of the prior art problems mentioned herein. According to a first aspect of the invention, apparatus is provided for modulating the position of a plasma across an area in a CVD reactor at a rate faster than the decay of the plasma species. According to a second aspect of the present invention, thermal gradients imposed by the thermal profile of the plasma during diamond deposition can be reduced by combining plasma motion with modulation of the power delivered to the plasma according to the instantaneous position of the plasma. For example, if a substrate is hotter at the center than at the edges, the plasma power can be reduced as the plasma location moves over the center of the sample, and increased as it moves over either of the cooler edge regions. In this way, the power applied to the plasma, and therefore the heat which is transferred to the substrate, is modulated in proportion.

DETAILED DESCRIPTION OF A PREFERRED EMBODIMENT

Those of ordinary skill in the art will realize that the following description of the present invention is illustrative only and not in any way limiting. While the present disclosure utilizes formation of CVD diamond material as an illustrative example, those of ordinary skill in the art will appreciate the applicability of the principles of the present invention to CVD deposition techniques for other materials as well. Other embodiments of the invention and applications therefor will readily suggest themselves to such skilled persons.

According to a first aspect of the present invention, a small plasma can be made to move back and forth over a controlled area in a CVD rector at a rate which is rapid compared to the decay time of the excited species it produces. Such a moving plasma is for all chemical purposes equivalent to a large, stationery plasma. Plasma motion can be achieved by modulating the phase of incident and/or reflected waves which comprise the standing wave pattern which determines plasma location.

Figure 1A:
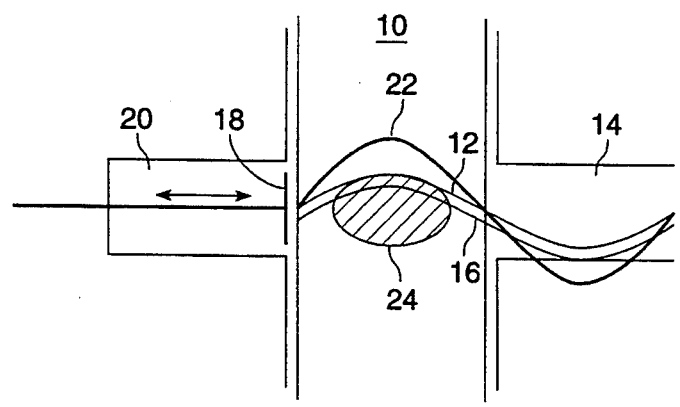
FIG. 1a is a diagram showing the relationship between plasma position and interference of in-phase incident and reelected microwaves in a CVD reactor.
Figure 1B:
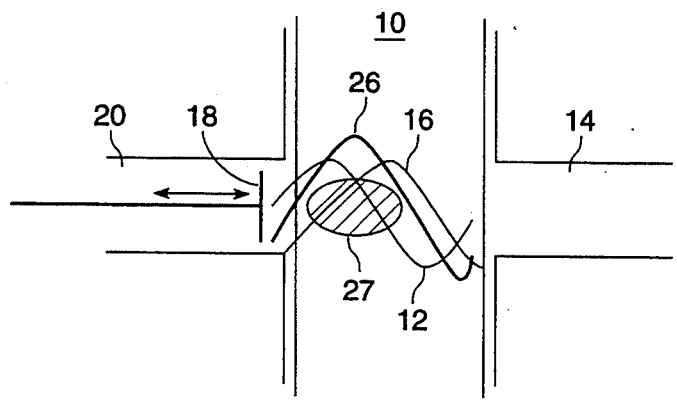
FIG. 1b is a diagram showing the relationship between plasma position and interference of incident wave and phase displaced reflected wave in a CVD reactor.
Figure 1C:
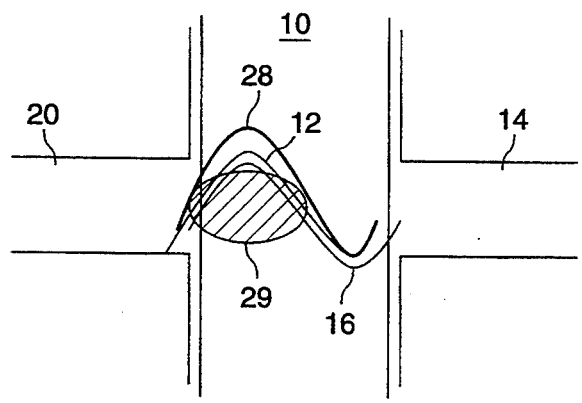
FIG. 1c is a diagram showing the relationship between plasma position and interference of phase-displaced incident wave and phase-displaced reflected waves in a CVD reactor.

Referring first to FIGS. 1a-1c, a presently preferred power efficient means for inducing plasma motion according to the present invention employs appropriate phase modulation of both incident and reflected waves. FIGS. 1a-1c show the relationships between incident and reflected waves in a typical microwave CVD diamond reactor.

FIG. 1a shows the condition in chamber 10 in which an incident wave 12 introduced into chamber 10 via waveguide 14 and a reflected wave 16 from sliding short or stub 18 moveable within waveguide 20 are in phase and intersect in the middle of the chamber 10. The heavier trace 22 in FIG. 1a represents the resultant composite wave from the summing of waves 12 and 16. The cross-hatched oval 24 indicates the location of a plasma region in chamber 10 under the conditions of FIG. 1a. This is the normal condition encountered in a microwave CVD plasma reactor operated in the so-called cavity mode.

FIG. 1b shows the condition in which a phase shift has been imposed on the reflected wave 16 by moving the sliding short or stub 18 further into waveguide 20. The heavier trace 26 in FIG. 1b represents the resultant composite wave from the summing of incident and reflected waves 12 and 16. The cross-hatched oval 28 indicates the location of a plasma region in chamber 10 under the conditions of FIG. 1b.

FIG. 1c shows a condition in which both incident wave 12 and reflected wave 16 have been phase-shifted approximately the same amount with respect to the chamber 10. This phase shift of both incident and reflected waves may be produced by any of a variety of phase shifting means known to the art, one of particular utility being the spinning dielectric blocks described herein. As the plasma position is determined largely by the phase relationships between the incident and reflected wave, it will be apparent to those of ordinary skill in the art that continuous control of the phase relationship, and therefore of the phase modulator components, is essential for optimum operation of the invention. The heavier trace 30 in FIG. 1c represents the resultant composite wave from the summing of incident and reflected waves 12 and 16. The cross-hatched oval 32 indicates the location of a plasma region in chamber 10 under the conditions of FIG. 1c.

As may be seen from a comparison of FIGS. 1a-1c, a smaller plasma 28 is produced under the conditions of FIG. 2b than in the two cases in which both incident and reflected waves are fully in phase as shown diagrammatically by cross-hatched ovals 24 and 32. Thus, although plasma displacement can be caused by phase modulation of either the incident or the reflected wave, optimum operation (no reduction in plasma power) is achieved when both waves are phase modulated in synchrony.

Those of ordinary skill in the art will recognize the potential for deliberately controlling the magnitude of the plasma by inducing controlled phase shifts between the incident and the reflected waves.

There are a number of well known prior art means for inducing phase modulation such as is shown in FIGS. 1a–1c. These means differ greatly in their feasibility and cost effectiveness. Some phase modulation methods are not effective at high power, such as that needed for plasma generation. Others are effective at high power, but are not capable of rapid operation because they involve reciprocating motion of bulky mechanical components.

Figure 2:
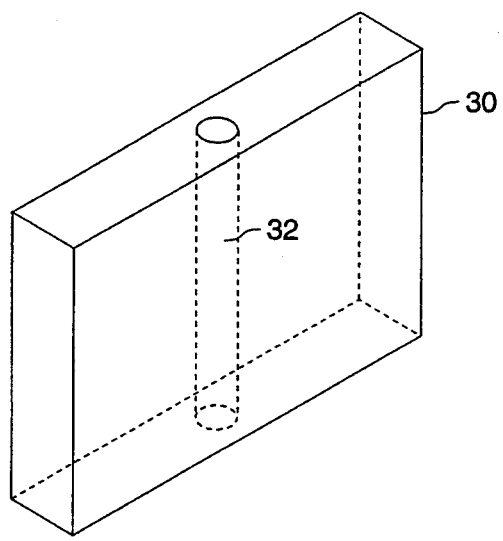
FIG. 2 is an isometric view of a dielectric block phase modulator according to a presently preferred embodiment of the invention.

According to a preferred embodiment of the present invention, a block 30 of material having suitable microwave transmission and structural characteristics is prepared as shown in FIG. 2. In general, the block 30 should be a dielectric material with low losses at the frequencies of interest, and with a dielectric constant convenient for the degree of phase modulation desired. Examples of useful materials include fused quartz, Teflon, and alumina. Block 30 is shown in FIG. 2 incorporating a bore 32 through it for mounting of a shaft, although those of ordinary skill in the art will recognize that other means may be employed to mount block 30 to a shaft.

Figure 3A:
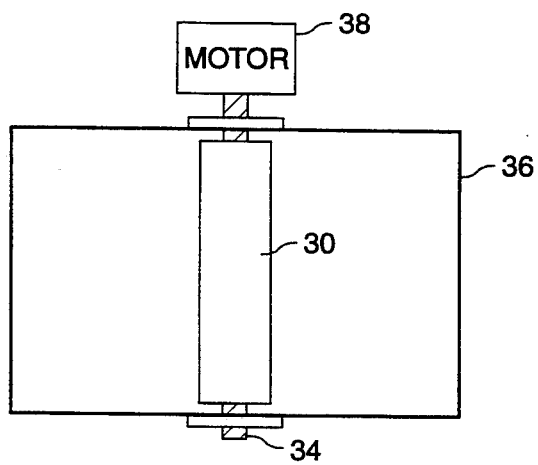
FIG. 3a is a cross sectional view of a block of FIG. 2 mounted on a shaft and disposed in a waveguide, with the block shown oriented with its long dimension in uhe plane of the wave propagation.
Figure 3B:
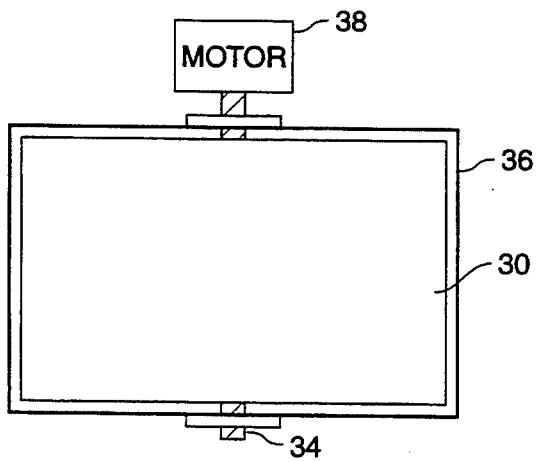
FIG. 3b is a cross sectional view of a block of FIG. 2 mounted on a shaft and disposed in a waveguide, with the block shown oriented with its short dimension in the plane of the wave propagation.

As shown in FIGS. 3a and 3b, block 30 is mounted on a spin shaft 34 and arranged inside a waveguide 36 so that the block 30 may freely spin when a torque is applied to the spin shaft 34 by motor 38. In FIGS. 3a and 3b, the plane of the figures is perpendicular to the direction of microwave propagation along the waveguide 36.

As the dielectric block spins within the waveguide, the long axis of the block is successively in line with (FIG. 3a), and perpendicular to (FIG. 3b), the direction of propagation of the microwave radiation through waveguide 36. When block 30 is in line with the direction of microwave energy propagation it presents a certain distance (equal to the length of the block) which exhibits a higher dielectric constant than does a section of waveguide without a block installed. Because of the wellknown reduction in electromagnetic wave propagation velocity with increased dielectric constant in the propagation medium, the microwave exhibits a phase shift with respect to the unperturbed wave phase. This phase shift is maximized when the long dimension of the block 30 is aligned with the microwave propagation path through waveguide 36, as shown in FIG. 3a, because the propagation path through the increased dielectric constant medium is at a maximum.

As the block 30 rotates in the waveguide 36 from its position shown in FIG. 3a where its long dimension is parallel to the direction of propagation to the angular shaft position 8 where the thinnest dimension of the block 30 is presented to the wavetrain as shown in FIG. 3b, the phase modulation decreases to a minimum. The frequency of phase modulation (but not the amplitude) can be varied by changing the angular acceleration of the shaft 36, and hence rotation rate of the block 30. The amplitude of the phase modulation can be varied by changing the ratio of length to thickness of block 30 and/or by selecting a material with higher dielectric constant. The amplitude of phase modulation will vary as the square root of the dielectric constant of the block material.

The means disclosed herein for providing phase modulation of the microwave signal is particularly effective because of the high frequencies of modulation (and hence rapidity of plasma displacement) it permits. Those of ordinary skill in the art will observe that each rotation of the block 30 causes two full cycles of phase modulation because the long dimension of the block is aligned parallel to the microwave propagation path twice per shaft revolution. This effect therefore modulates the microwave train at twice the rotational frequency of the shaft 34. In addition, the absence of any reciprocal motion in the phase modulator mechanism allows very high motion rates. This is a consequence of the well-known principal that rotating systems can achieve much higher frequencies than reciprocating systems, which must repeatedly accelerate and decelerate.

Modulation of the plasma position in a rapid, continuous fashion according to the teachings of the present invention allows the creation of a zone excitation whose volume is large compared to the unmodulated plasma. This is clearly important in providing the ability to perform more uniform depositions over larger areas. If the plasma modulation frequency is rapid compared to the time within which critical excited species disappear (usually in the millisecond range), concentrations of excited species will not decay significantly from one cycle of modulation to the next. Restated, a small plasma which is swept sufficiently rapidly through a larger volume becomes the chemical equivalent of a large-volume plasma.

In a cavity-mode microwave CVD deposition system built and operated for the deposition of diamond thin films, a phase modulator assembly as described herein was inserted between the deposition chamber and a sliding short or sliding stub component as described above in FIGS. 1a–1c. The phase modulator assembly consisted of a section of standard #284 microwave waveguide 4" in length, with standard flanges affixed to permit easy insertion of the component into the waveguide train. The phase modulator block comprised a fused quartz block having a thickness of approximately 0.5", a length of approximately 2.5", and a height of approximately 1", supported by a press-fit Teflon shaft approximately ¼" in diameter extending through the center of the quartz block in the 1" (height) dimension.

The block was centered within the waveguide section on ball bearings attached to the outer waveguide surfaces, which bearings supported the Teflon drive shaft, and was made to spin at approximately 600 revolutions per minute through the action of a simple DC motor directly coupled to the Teflon shaft. The plasma was observed to move back and forth in a reciprocating motion too rapid to follow with the unaided eye when the motor reached its operating speed.

The extent of plasma excursion was approximately 1.5", and the plasma track was positioned over a rotating 3" silicon wafer to carry out diamond deposition in a manner well-known to those skilled in the art. Microwave power input to the reactor was approximately 1800 watts, deposition pressure was 75 Torr, and a gas mixture consisting of 200 sccm hydrogen, 6 sccm methane, and 3 sccm carbon monoxide was used.

A film using the apparatus and method of the present invention was produced consisting of diamond deposited uniformly over the three-inch wafer from its center to within ⅛" of its edge, at which point the deposition was masked off by the component employed to restrain the wafer during deposition. This deposit, approximately 2.75" in diameter, showed no center-to-edge gradient in appearance, surface morphology, or thickness. A comparison deposition test was made using the above-recited conditions, but without the phase modulator in operation. In this comparison test, a deposit approximately 1.6" in diameter was produced with a strongly center-to-edge thickness gradient in morphology and thickness. The deposition carried out with use of the phase modulator apparatus of the present invention produced a diamond film having a thickness approximately 260% that of the film produced without the phase modulator, and with much better thickness and morphology uniformity over the entire deposit.

Figure 4A:
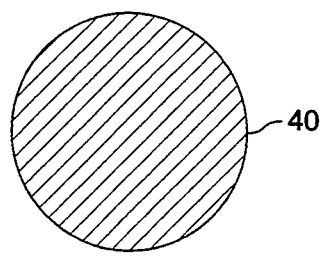
FIGS. 4a and 4b are schematic views showing the effect of moving a small plasma by use of apparatus such as disclosed in the present invention.
Figure 4B:
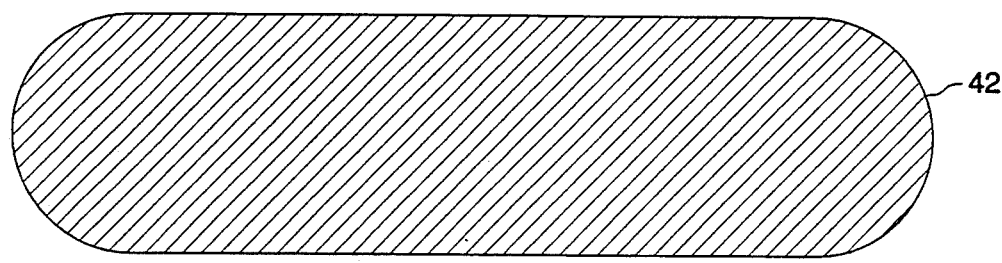

FIG. 4a and 4b schematic representations of effective plasma size showing the effect of moving a small plasma by use of the apparatus disclosed above. From an examination of FIGS. 4a and 4b, it is apparent how the effective volume of a small plasma indicated by cross-hatched area 40 can be increased to an apparent size indicated by cross-hatched area 42 through this process.

Figure 5:
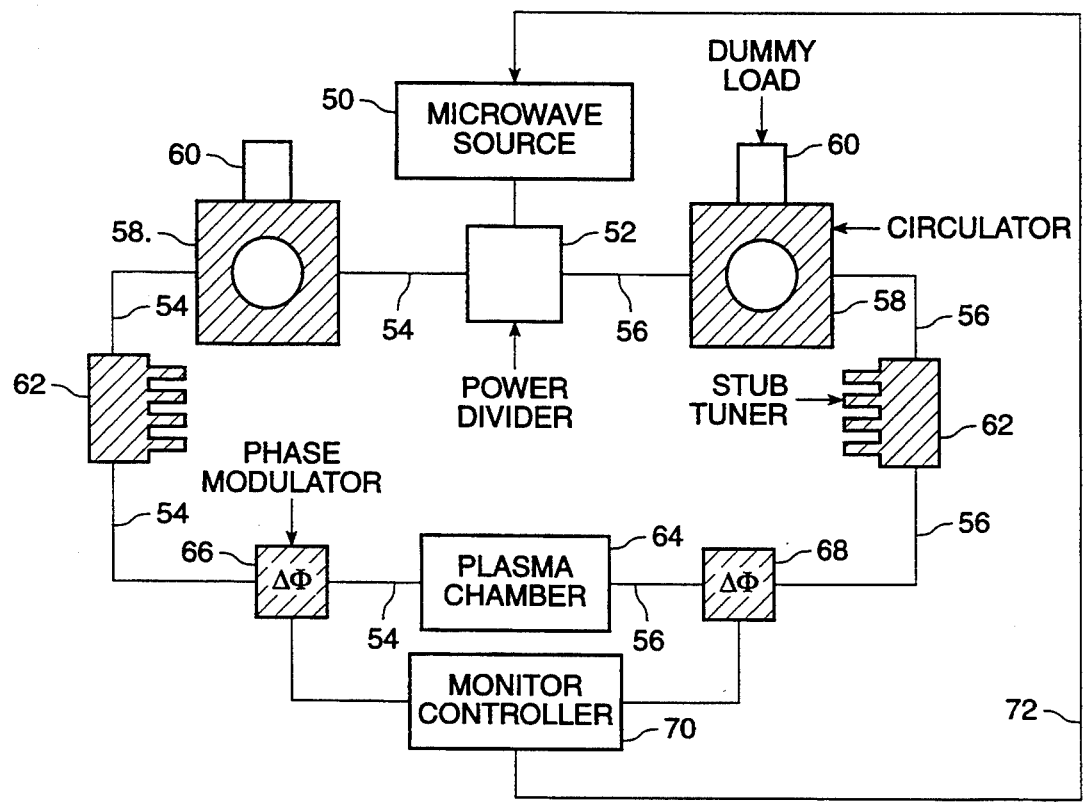
FIG. 5 is block diagram of a presently preferred embodiment of a phase-modulation system according to the present invention as applied to a microwave CVD reactor.

A preferred embodiment of the phase modulation system according to the present invention as applied to a microwave CVD reactor is shown schematically in FIG. 5. Radiation from a single microwave source 50 is split into two equal portions by a power divider 52 and directed down two microwave feed waveguides 54 and 56, shown schematically as single lines. This arrangement assures identical phases between the two waves at the point of their separation into the two delivery waveguides 54 and 56. Waveguides 54 and 56 are constructed to be identical in length, again to assure no inadvertent phase shift between the two waves as a result of their propagation down the waveguides 54 and 56.

Other conventional microwave components, such as circulators 58, dummy loads 60, and stub tuners 62, are shown in the waveguide paths 54 and 56. These components are well known to those of ordinary skill in the art and are not central to the phase modulation function.

CVD reactor chamber 64 receives microwaves from the two opposed microwave feed waveguides 54 and 56 through two phase modulator components 66 and 68, which may be constructed as illustrated in FIGS. 3a and 3b. One phase modulator is provided in each waveguide arm 54 and 56, to provide independent modulation of the two microwave waves. The modulator blocks 30 (shown in FIGS. 2 and 3a) in phase modulator components 66 and 68 are oriented with respect to one another so as to modulate one incident wave in the positive direction (i.e., advancing phase), while modulating the other, opposed, incident wave in the negative (i.e., retarding phase) direction, and may be maintained in correct rotational synchrony by use of a computerized motor controller 70, which establishes the desired angular relationship between the modulators and prevents any drift during operation. Such motor controllers are well known in the art and will not be described herein in order to avoid overcomplicating the disclosure.

Those of ordinary skill in the art will appreciate that the specific phase relationship between the modulator components will be determined by specific process requirements (including, but not necessarily limited to, extent of plasma excursion and velocity of excursion as a function of plasma position). It will be further appreciated that the velocity vs. position characteristic of the plasma motion can be altered by the use of dielectric blocks 30 which are specially shaped to present a particular profile vs. rotation position within the waveguide.

For example, blocks with a thicker cross-section at their ends than at their centers will tend to increase the time that a maximum dielectric path length exists when they are aligned with the direction of wave propagation down the waveguide. Assuming a constant angular acceleration of the block, this in turn causes the plasma to remain at its furthest excursion for a longer duration than when using a straight-section block, allowing concentration of the plasma at the motion extrema, which may be desirable for any of several reasons.

Because the plasma regions in a CVD reactor are small and located quite close to or in contact with the substrate, the rate of local heat delivery to the substrate is greatest nearest the plasma. The substrate region nearest the center of the plasma region is therefore the hottest region. Such a thermal gradient resulting from substrate heating in microwave-enhanced diamond CVD systems due to radiation from plasma regions is illustrated in FIG. 6 as a graph of substrate temperature vs. distance, where the zero point on the x-axis is the center of the plasma.

According to a second aspect of the present invention, thermal gradients imposed by the thermal profile of the plasma during diamond deposition can be reduced or can be otherwise selectively customized by combining the techniques of the present invention plasma motion as described above with modulation of the power delivered to the plasma according to the instantaneous position of the plasma. Referring again to FIG. 5, presently preferred apparatus for implementing this aspect of the invention includes a plasma position feedback signal loop 72 from the phase modulator motor controller 70 to the microwave source. The signal on plasma position feedback signal loop 72 may be used to modulate the power output of microwave source 50 as a function of the position of the plasma in plasma chamber 64 as indicated by the signal on plasma position feedback signal loop 72. The generation of such feedback signals and the use of signals to modulate microwave power sources is well within the level of ordinary skill in the art.

Figure 6:
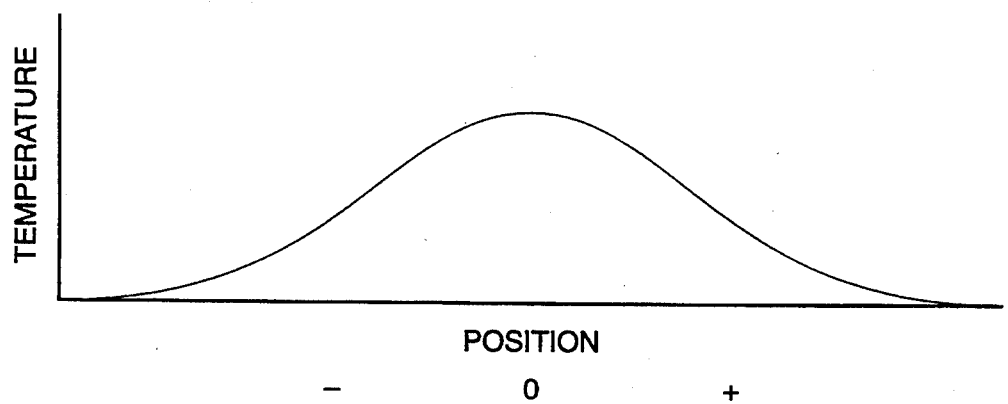
FIG. 6 is a graph showing substrate temperature as a function of position in a typical CVD reactor.

As an example of the useful modulation of microwave power as a function of plasma position, the graph of FIG. 6 may be considered. If, as indicated by FIG. 6, a substrate is hotter at its center than at its edges, and uniformity of temperature is desired, the plasma position feedback signal on line 72 may be used to reduce plasma power as the plasma location moves over the center of the sample, and increased as it moves over either of the cooler edge regions. In this way, the power applied to the plasma, and therefore the heat which is transferred to the substrate, is modulated as a function of substrate position, resulting in a more uniform temperature distribution across the substrate.

It will be apparent that a further capability conferred by the modulation of plasma power as a function of plasma position according to the present invention is the ability to generate and impose functional nonuniformities in temperature across substrates for the purpose of modifying the local thickness and/or properties of diamond and other materials deposited on substrates. This capability may be used, for example, to provide local thickness enhancement to overcome stress concentration in mechanical components without incurring the expense of depositing thick diamond film everywhere. Similarly, thermal conductivity can be locally varied by changing diamond thickness and composition through use of plasma power modulation. Other applications will readily suggest themselves to those skilled in the art.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. Apparatus for continuously varying the position of a plasma within a microwave-enhanced CVD deposition reactor including a reaction chamber, comprising:
   a first waveguide communicating with said reaction chamber;
   a second waveguide communicating with said reaction chamber, said second waveguide being oriented in opposing relation to said first waveguide with respect to said reaction chamber, said first and second waveguides having substantially the same lengths;
   a microwave energy source for propagating first and second microwave energy to said reaction chamber through said first and second waveguides, said first and second microwave energy being substantially in phase with each other and substantially equal in magnitude, for creating a standing wave in said reaction chamber resulting from the combination of said first and second microwave energy;
   a first phase-altering means, located in said first waveguide, for altering the relative phase of microwave energy in said first waveguide;
   a second phase-altering means, located in said second waveguide, for altering the relative phase of microwave energy in said second waveguide;
   means for constantly operating said first and second phase-altering means while operating said reactor to constantly vary the position of the maxima of said standing wave within said reaction chamber.

2. The apparatus of claim 1 wherein:
   said first phase-altering means comprises a first block of dielectric material rotatably mounted in a fixed position on a first shaft in said first waveguide, said first block of dielectric material shaped such that it presents different thicknesses along the axis of said first waveguide at different angular positions of said first shaft;
   said second phase-altering means comprises a second block of dielectric material rotatably mounted in a fixed position on a second shaft in said second waveguide, said second block of dielectric material shaped such that it presents different thicknesses along the axis of said second waveguide at different angular positions of said second shaft; and
   shaft rotating means for continuously rotating said first and second shafts.

3. The apparatus of claim 2 wherein:
   said first and second blocks of dielectric material are shaped as rectangular solids each having a height, a width, and a thickness, said thickness being different from said width; and
   wherein said first and second shafts are located on an axis comprising the locus of points defining the center of their width and thickness.

4. The apparatus of claim 3 wherein said first and second blocks each have a cross-sectional shape selected to impart a selected motion profile to a plasma in said reaction chamber.

5. The apparatus of claim 2 wherein said shaft rotating means is for rotating said first and second shafts at a constant angular velocity.

6. The apparatus of claim 1, further including means for modulating said microwave energy source in response to the rotational positions of said first and second shafts such that said first and second microwave energy output of said microwave energy source is a function of the orientation of said first and second blocks in said first and second waveguides.

7. Apparatus for performing microwave-enhanced CVD diamond film deposition at a pressure of greater than about 1 torr, comprising:
   a CVD reactor including a reaction chamber;
   a first waveguide communicating with said reaction chamber;
   a second waveguide communicating with said reaction chamber, said second waveguide being oriented in opposing relation to said first waveguide with respect to said reaction chamber, said first and second waveguides having substantially the same lengths;
   a microwave energy source for propagating first and second microwave energy to said reaction chamber through said first and second waveguides, said first and second microwave energy being substantially in phase with each other and substantially equal in magnitude, for creating a standing wave in said reaction chamber resulting from the combination of said first and second microwave energy;
   a first phase-altering means, located in said first waveguide, for altering the relative phase of microwave energy in said first waveguide;
   a second phase-altering means. located in said second waveguide, for altering the relative phase of microwave energy in said second waveguide;
   means for constantly operating said first and second phase-altering means while operating said reactor to constantly vary the position of the maxima of said standing wave within said reaction chamber.

8. The apparatus of claim 7 wherein:
   said first phase-altering means comprises a first block of dielectric material rotatably mounted in a fixed position on a first shaft in said first waveguide, said first block of dielectric material shaped such that it presents different thicknesses along the axis of said first waveguide at different angular positions of said first shaft;
   said second phase-altering means comprises a second block of dielectric material rotatably mounted in a fixed position on a second shaft in said second waveguide, said second block of dielectric material shaped such that it presents different thicknesses along the axis of said second waveguide at different angular positions of said second shaft; and
   shaft rotating means for continuously rotating said first and second shafts.

9. The apparatus of claim 8 wherein:
   said first and second blocks of dielectric material are shaped as rectangular solids each having a height, a width, and a thickness, said thickness being different from said width; and
   wherein said first and second shafts are located on an axis comprising the locus of points defining the center of their width and thickness.

10. The apparatus of claim 9 wherein said first and second blocks each have a cross-sectional shape selected to impart a selected motion profile to a plasma in said reaction chamber.

11. The apparatus of claim 8 wherein said shaft rotating means is for rotating said first and second shafts at a constant angular velocity.

12. The apparatus of claim 7, further including means for modulating said microwave energy source in response to the rotational positions of said first and second shafts such that said first and second microwave energy output of said microwave energy source is a function of the orientation of said first and second blocks in said first and second waveguides.

* * * * *

UNITED STATES PATENT AND TRADEMARK OFFICE
CERTIFICATE OF CORRECTION

PATENT NO. : 5,449,412
DATED : September 12, 1995
INVENTOR(S) : John M. Pinneo

It is certified that error appears in the above-indentified patent and that said Letters Patent is hereby corrected as shown below:

Title page, under item [73], "Notice", replace "Jul. 27, 2010" with --Dec. 17, 2011--.
Column 2, line 9, delete "t".
Column 2, line 64, after "in" insert --the--.
Column 3, line 32, replace "reelected" with --reflected--.
Column 3, line 46, replace "uhe" with --the--.
Column 4, line 40, replace "28" with --27--.
Column 4, line 56, replace "30" with --28--.
Column 4, line 59, replace "28" with --27--.
Column 4, line 62, replace "28" with --27--.
Column 4, line 63, replace "FIG. 2b" with --FIG. 1b--.
Column 4, line 65, replace "32" with --29--.
Column 5, line 27, replace "Lo" with --to--.
Column 5, line 56, delete "8".
Column 5, line 65, replace "36" with --34--.
Column 6, line 61, replace "Tort" with --Torr--.
Column 7, line 65, after "4b" insert --are--.

UNITED STATES PATENT AND TRADEMARK OFFICE
CERTIFICATE OF CORRECTION

PATENT NO. : 5,449,412
DATED : September 12, 1995
INVENTOR(S) : John M. Pinneo

It is certified that error appears in the above-indentified patent and that said Letters Patent is hereby corrected as shown below:

Column 9, line 42, replace "matedal" with --material--.
Column 10, line 35, replace "." with --,--.

Signed and Sealed this

Ninth Day of January, 1996

Attest:

BRUCE LEHMAN

Attesting Officer	Commissioner of Patents and Trademarks